United States Patent
Kondo

(10) Patent No.: US 11,106,129 B2
(45) Date of Patent: Aug. 31, 2021

(54) IMPRINT APPARATUS, IMPRINT METHOD, AND METHOD OF MANUFACTURING ARTICLE

(71) Applicant: CANON KABUSHIKI KAISHA, Tokyo (JP)

(72) Inventor: Hiroyuki Kondo, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 189 days.

(21) Appl. No.: 16/371,542

(22) Filed: Apr. 1, 2019

(65) Prior Publication Data

US 2019/0310547 A1 Oct. 10, 2019

(30) Foreign Application Priority Data

Apr. 6, 2018 (JP) .............................. JP2018-074042

(51) Int. Cl.
*G03F 7/00* (2006.01)

(52) U.S. Cl.
CPC .................................. *G03F 7/0002* (2013.01)

(58) Field of Classification Search
CPC ............... G03F 7/0002; G03F 7/70775; G03F 7/70825; H01L 21/027
See application file for complete search history.

(56) References Cited

FOREIGN PATENT DOCUMENTS

| JP | 4667524 B2 | 4/2011 |
| JP | 5198282 B2 | 5/2013 |
| WO | 2007067469 A2 | 6/2007 |
| WO | 2007126767 A2 | 11/2007 |

*Primary Examiner* — Robert J Grun

(74) *Attorney, Agent, or Firm* — Rossi, Kimms & McDowell LLP

(57) ABSTRACT

An imprint apparatus performs an imprint process for forming a pattern of a cured product of an imprint material on a substrate by using a mold. The apparatus includes a substrate holder configured to hold the substrate, a substrate deformation mechanism configured to deform the substrate so the substrate will have a convex shape toward the mold in a state in which the substrate is held by the substrate holder, and a controller configured to control the deformation of the substrate by the substrate deformation mechanism in accordance with orientation information related to a crystal orientation of the substrate and a target shot region on which the imprint process is to be performed among a plurality of shot regions on the substrate.

12 Claims, 12 Drawing Sheets

IMPRINT APPARATUS, IMPRINT METHOD, AND METHOD OF MANUFACTURING ARTICLE

BACKGROUND OF THE INVENTION

Field of the Invention

The present invention relates to an imprint apparatus, an imprint method, and a method of manufacturing an article.

Description of the Related Art

An imprint apparatus forms a pattern on a substrate by curing an imprint material in a state in which the imprint material on the substrate is in contact with a mold. In an imprint apparatus, there is a technique to deform one end of a mold or a substrate so the mold or the substrate will have a convex shape toward the other end. In Japanese Patent No. 5198282, it is disclosed that a mold will be deformed so as to have a convex shape toward a substrate when the mold is to be brought into contact with an imprint material on the substrate. In Japanese Patent No. 4667524, it is disclosed that a substrate will be deformed so as to have a convex shape toward a mold.

SUMMARY OF THE INVENTION

The present inventor has found that a deflection amount (a difference between the level of an evaluation point before the deformation and the level of the evaluation point after the deformation) of a substrate varies among a plurality of shot regions when a substrate deformation method is employed to make a substrate have a convex shape toward a mold. A deflection amount variation can increase the possibility of a collision between the substrate and the mold. This can cause degradation or damage on the mold and generate a defect on the pattern to be formed. However, productivity can degrade greatly if conditions for controlling the contact between the substrate and the mold are adjusted by trial and error for each shot region in order to solve such a disadvantage.

The present invention provides an imprint technique advantageous in improving productivity.

One of aspects of the present invention provides an imprint apparatus that performs an imprint process to form a pattern of a cured product of an imprint material on a substrate by using a mold, the apparatus comprising: a substrate holder configured to hold the substrate; a substrate deformation mechanism configured to deform the substrate so the substrate will have a convex shape toward the mold in a state in which the substrate is held by the substrate holder; and a controller configured to control the deformation of the substrate by the substrate deformation mechanism in accordance with orientation information related to a crystal orientation of the substrate and a target shot region on which the imprint process is to be performed among a plurality of shot regions on the substrate.

Further features of the present invention will become apparent from the following description of exemplary embodiments with reference to the attached drawings.

DESCRIPTION OF THE EMBODIMENTS

Exemplary embodiments of the present invention will be described hereinafter with reference to the accompanying drawings.

Figure 1:
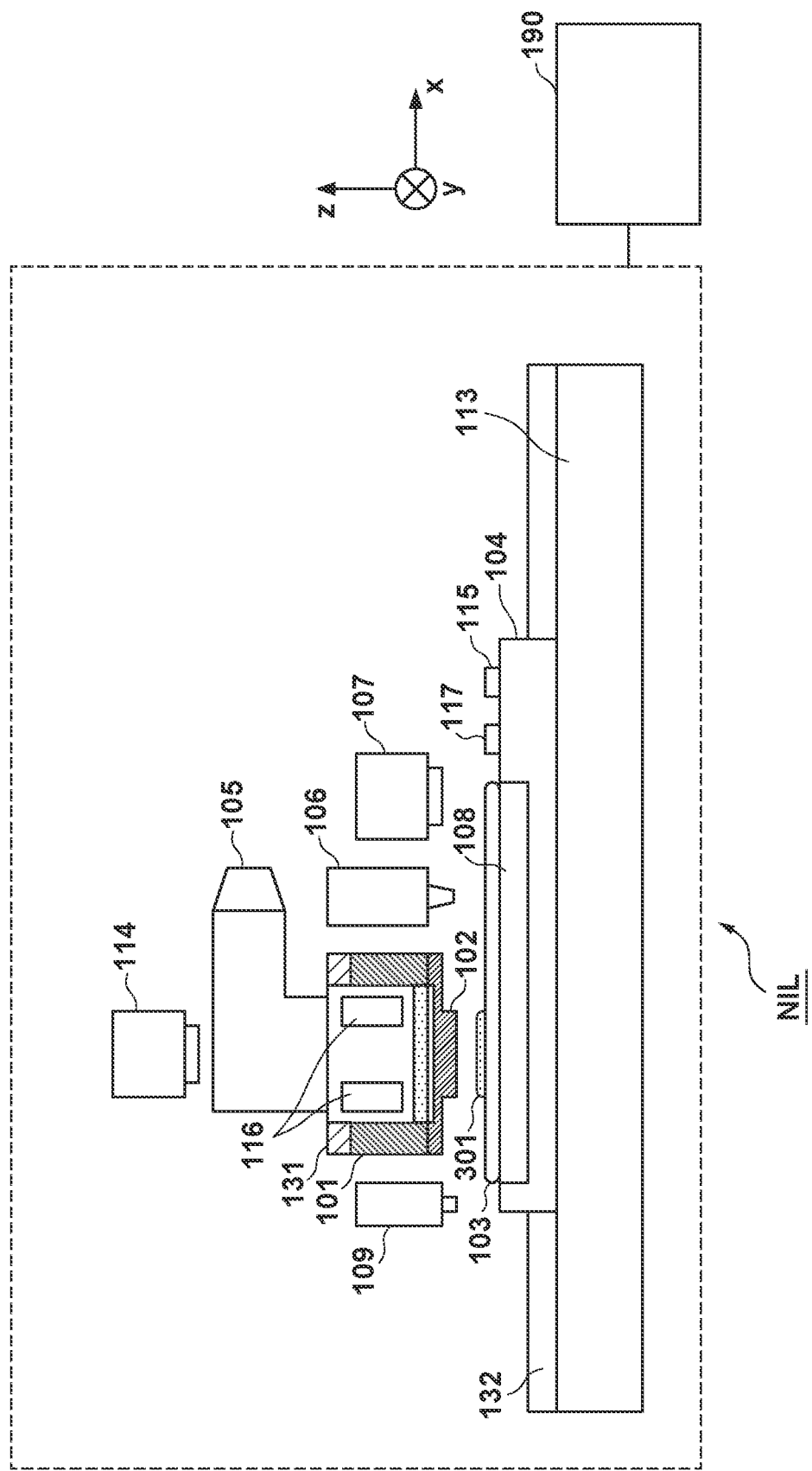
FIG. 1 is a view schematically showing the arrangement of an imprint apparatus according to an embodiment of the present invention.

FIG. 1 schematically shows the arrangement of an imprint apparatus NIL according to an embodiment of the present invention. The imprint apparatus NIL performs an imprint process of bringing a mold 102 and an imprint material 301 supplied on a substrate 103 in contact with each other and curing the imprint material 301 in this state to form a pattern of the cured product of the imprint material 301. The imprint material is a curable composition which is cured when energy for curing is supplied. The imprint material may represent a cured state or may represent an uncured state. As the energy for curing, an electromagnetic wave, heat, or the like can be used. The electromagnetic wave is, for example, light (such as infrared rays, visible light, or UV rays) whose wavelength is selected from a range of 10 nm to 1 mm.

Typically, the curable composition is a composition cured by light irradiation or heating. Among these, a photo-curable composition cured by light can contain at least a polymerizable compound and a photopolymerization initiator. A photo-curable composition can also contain a nonpolymerizable compound or a solvent as needed. The nonpolymerizable compound can be at least one material selected from the group consisting of a sensitizer, a hydrogen donor, an internal mold release agent, a surfactant, an antioxidant, and a polymer component.

In the specification and the accompanying drawings, directions will be indicated by an XYZ coordinate system in which directions parallel to the surface of a holding surface of a substrate holder 108 configured to hold the substrate 103 are set as the X-Y plane. Assume that directions parallel to the X-axis, the Y-axis, and the Z-axis of the XYZ coordinate system are the X direction, the Y direction, and the Z direction, respectively. Assume that a rotation about the X-axis, a rotation about the Y-axis, and a rotation about the Z-axis are θX, θY, and θZ, respectively. Control operations or driving operations related to the X-axis, the Y-axis, and the Z-axis represent control operations or driving operations related to a direction parallel to the X-axis, a direction parallel to the Y-axis, and a direction parallel to the Z-axis, respectively. In addition, control operations or driving operations related to the ex-axis, the θY-axis, and the θZ-axis indicate control operations or driving operations related to a rotation about an axis parallel to the X-axis, a rotation about an axis parallel to the Y-axis, and a rotation about an axis parallel to the Z-axis, respectively.

An imprint apparatus NIL includes, for the operation of the substrate 103, a substrate stage 104, a support base 113 which supports the substrate stage 104, and a substrate driver 132 which drives the substrate 103 by driving the substrate stage 104. The substrate holder 108 for holding the substrate 103 is embedded in the substrate stage 104. A reference mark 115 can be arranged on the substrate stage 104. The imprint apparatus NIL includes, for the operation of the mold 102, a mold holder 101 configured to hold the mold 102 and a mold driver 131 that drives the mold 102 by driving the mold holder 101. The substrate driver 132 and the mold driver 131 form a relative driving mechanism that adjusts the relative positions of the substrate 103 and the mold 102 with respect to the six axes of the X-axis, the Y-axis, the Z-axis, the ex-axis, the θX-axis, and the θZ-axis.

In one example, the substrate driver 132 drives the substrate stage 104 so as to drive the substrate 103 about a plurality of axes (for example, the three axes of the X-axis, the Y-axis, and the Z-axis), and the mold driver 131 drives the mold holder 101 so as to drive the mold 102 about a plurality of axes (for example, the X-axis, the Y-axis, the Z-axis, the ex-axis, the θX-axis, and the θZ-axis). Other than adjusting the relative positions of the substrate 103 and the mold 102 with respect to the X-axis, the Y-axis, the ex-axis, the θX-axis, and the θZ-axis, the relative driving mechanism adjusts the relative positions of the substrate 103 and the mold 102 with respect to the Z-axis. The adjustment of the relative positions of the substrate 103 and the mold 102 with respect to the Z-axis includes a contact operation in which an imprint material on the substrate 103 is brought into contact with the mold 102 and a separation operation in which the mold 102 is separated from the cured imprint material.

The imprint apparatus NIL can also include one or a plurality of alignment scopes 116, a substrate measuring device 109, an off-axis alignment scope 107, a curing unit 105, an observation unit 114, a dispenser (supply unit) 106, and a mold measuring device 117. The alignment scopes 116 output information indicating the relative positions of marks on the mold 102 and marks on the substrate 103, for example, an image of the marks on the mold 102 and the marks on the substrate 103, a moire image formed by the marks on the mold 102 and the marks on the substrate 103, and the like. In one example, marks positioned at the four corners of each shot region on the substrate 103 can be simultaneously observed by arranging the four alignment scopes 116.

The substrate measuring device 109 measures the shape of the surface of the substrate 103. More specifically, the substrate measuring device 109 can be formed so as to measure the height of the surface of the substrate 103 at each of a plurality of positions of the surface. The substrate measuring device 109 can include a sensor capable of measuring distance. The off-axis alignment scope 107 observes the marks on the substrate 103. The curing unit 105 cures an imprint material by supplying, onto an imprint material supplied on the substrate 103, the energy (for example, light) for curing the imprint material. The observation unit 114 observes the state of contact between the imprint material and the mold 102, and observes the imprint material filling state of the pattern on the mold 102. The dispenser (supply unit) 106 is a supply unit that supplies the imprint material 301 on the substrate 103. The dispenser 106 can include a discharge unit provided with a plurality of orifices for discharging the imprint material 301. The dispenser 106 can include a driving mechanism that drives the discharge unit about the plurality of axes (for example, six axes). The mold measuring device 117 measures the shape of the surface of the mold 102. More specifically, the mold measuring device 117 measures the height of the surface of the mold 102 at each of a plurality of positions on the surface. The mold measuring device 117 can include a sensor capable of measuring distance.

Figure 2A:
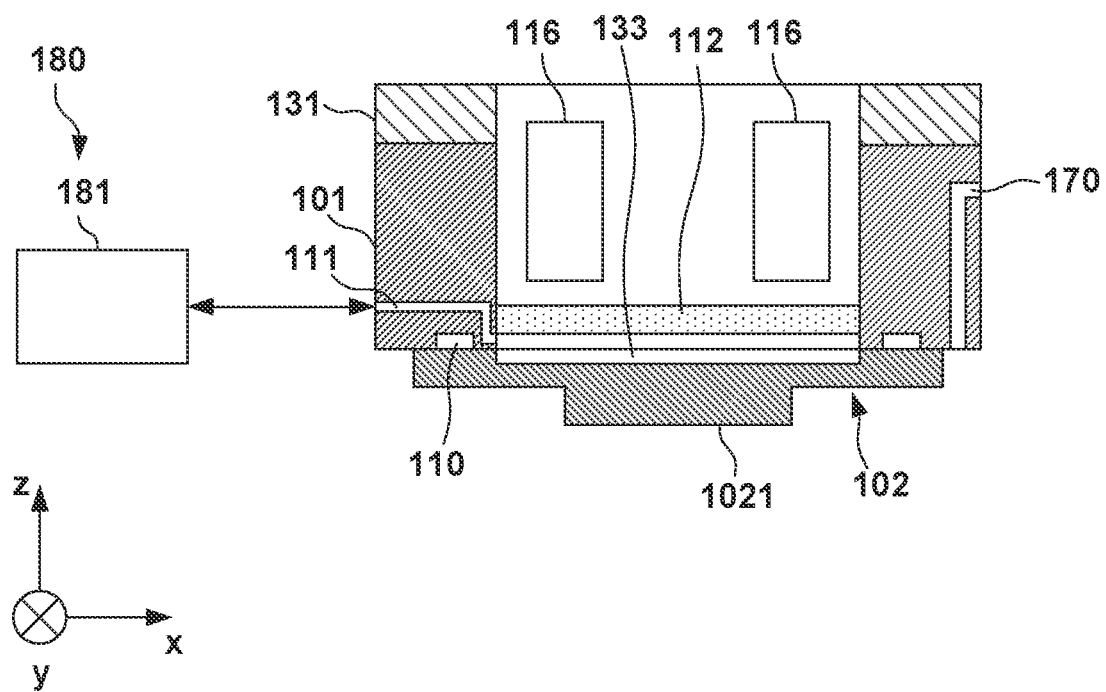
FIGS. 2A and 2B are a sectional view schematically showing the arrangement of a mold holder and its peripheral portion and a view schematically showing the arrangement of a substrate holder, respectively.

FIG. 2A is a sectional view schematically showing the arrangement of the mold holder 101 and its peripheral portions. The mold holder 101 includes, for example, a chucking unit 110 and holds the mold 102 by chucking the mold 102 by the chucking unit 110. The mold 102 includes a mesa-shaped pattern portion 1021, and a pattern is formed on the pattern portion 1021. The mold holder 101 has, for example, a structure (for example, a hollow structure) that allows the energy for curing supplied from the curing unit 105 to pass through. The mold holder 101 can include a sealing member (for example, sheet glass) 112 to form a pressure chamber 133 on the side of the back surface (a surface on the opposite side of the surface with the pattern formation) of the mold 102, a channel 111 for controlling the pressure of the pressure chamber 133, and a pressure controller 181. The pressure controller 181 is connected to the pressure chamber 133 via the channel 111. When the pressure controller 181 performs control to make the pressure in the pressure chamber 133 higher than the pressure of the external space, the mold 102 can be deformed so the center portion (pattern portion 1021) of the mold 102 will have a convex shape toward the substrate 103. The channel 111 and the pressure controller 181 form a mold deformation mechanism 180 that adjusts the deformation of the mold 102. The mold driver 131 is formed to drive the mold 102 about the plurality of axes (for example, the six axes of the X-axis, the Y-axis, the Z-axis, the ex-axis, the θX-axis, and the θZ-axis) by driving the mold holder 101 about the plurality of axes.

The imprint apparatus NIL can include a gas supplier 170 that supplies a purge gas to a space between the substrate 103 and the mold 102. The gas supplier 170 can include, for example, a channel provided in the mold holder 101.

As the purge gas, a gas which does not inhibit the curing of the imprint material, for example, a gas containing at least one of a helium gas, a nitrogen gas, and a condensable gas (for example, pentafluoropropane (PFP)) can be used. The imprint apparatus NIL further includes a controller 190 that controls each component described above.

Figure 2B:
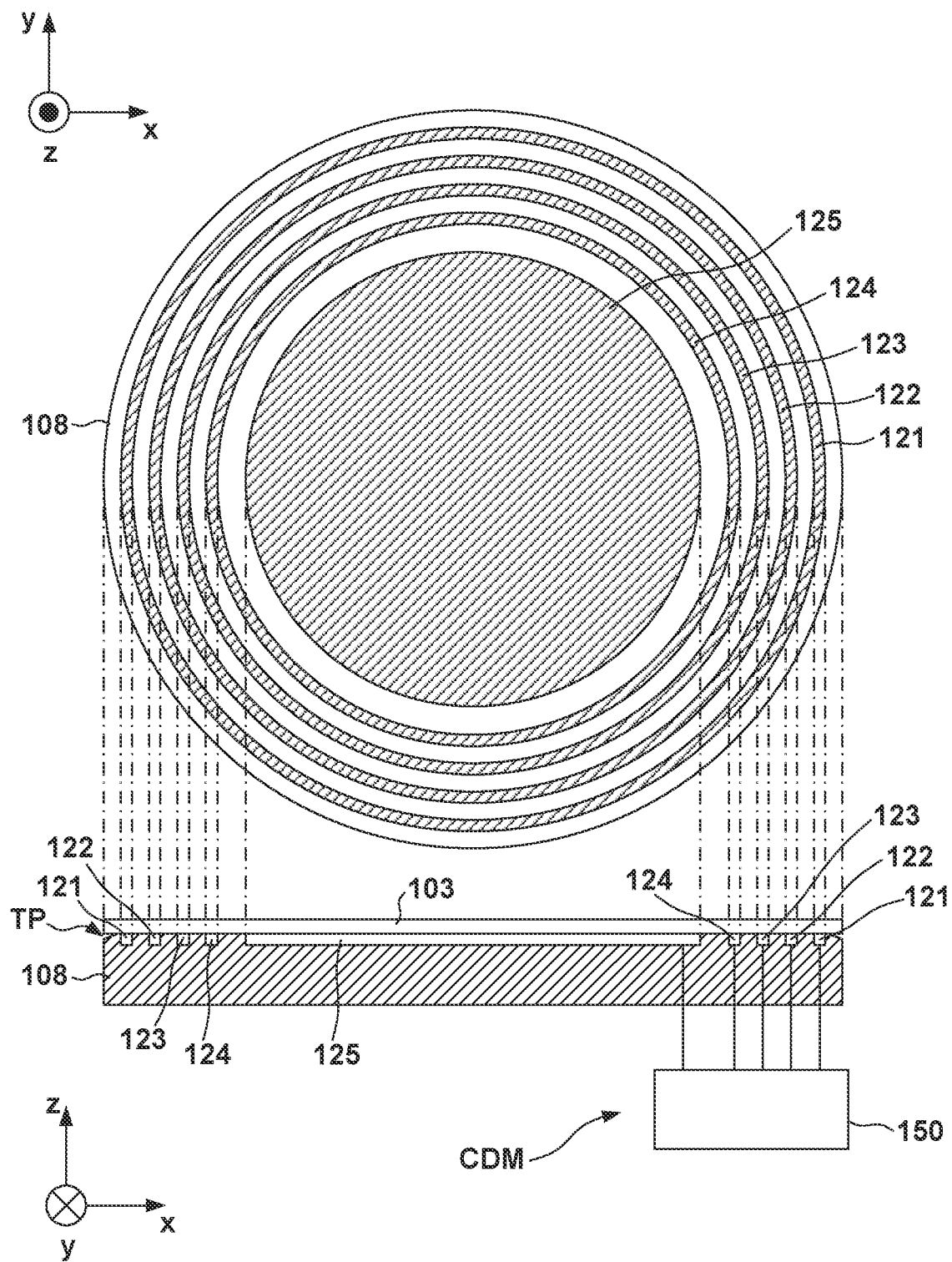

FIG. 2B schematically shows the arrangement of the substrate holder 108. The substrate holder 108 includes a substrate deformation mechanism CDM that deforms the substrate 103 while holding the substrate 103. The substrate deformation mechanism CDM may be understood as a component of the substrate holder 108 or may be understood as a component different from the substrate holder 108. The substrate deformation mechanism CDM controls the distribution of pressure on the back-surface side of the substrate 103 so the substrate 103 will have a target shape. The substrate deformation mechanism CDM can deform (cause deflection in) the substrate 103 so at least a part of the substrate 103 will have an upward convex shape (toward the mold 102). The substrate deformation mechanism CDM can include a plurality of concave portions 121 to 125 arranged on the surface of the substrate holder 108 and a pressure controller 150 that can individually control the pressure on the plurality of the concave portions 121 to 125.

For example, when the pressure controller 150 applies a negative pressure to the concave portions 121 and 125 and applies a positive pressure to the concave portions 122, 123, and 124, the substrate 103 can be held while deforming each of the portions on the substrate 103 corresponding to the concave portions 122, 123, and 124 to have an upward convex shape. The number of the concave portions 121 to 125 is not limited to five, and the number of portions can be changed in accordance with the requested specification. In addition, the value and the range of the pressure that can be individually applied to each of the concave portions 121 to 125 by the pressure controller 150 can be determined in accordance with the requested specifications.

The shapes of the concave portions 121 to 125 may be ring shapes or circular shapes concentrically arranged in the manner exemplified in FIG. 2B or may be another shape. The substrate 103 is provided to the substrate holder 108 so its center will match the center of the concentric circle. It is preferable for the substrate holder 108 to include a tapered portion TP at a peripheral portion of the surface facing the substrate 103. By arranging the tapered portion TP, it becomes easier to deform the substrate 103, in particular, the peripheral portion of the substrate 103 so that it will have an upward convex shape.

The substrate deformation mechanism CDM has, as described above, a function of holding the substrate 103 and a function of deforming the substrate 103. In another embodiment, these functions may be provided separately. For example, the substrate holding function may be provided by a vacuum chuck, and the substrate deforming function may be provided by an electrical device (for example, a piezoelectric element) and/or a mechanical device (for example, a cylinder). Alternatively, the substrate holding function may be provided by an electrical device (for example, an electrostatic chuck), and the substrate deforming function may be provided by a pressure control device as exemplified in FIG. 2B.

The substrate 103 can be formed from, for example, silicon, a plastic, gallium arsenide, mercury telluride, or a composite material containing two or more materials selected from these materials. An adjustment solution containing an additive for decreasing the surface energy can be spin-coated onto the surface of the substrate 103 in advance. Furthermore, an orientation flat or a notch for specifying the crystal orientation is formed in the substrate 103.

Figure 3:
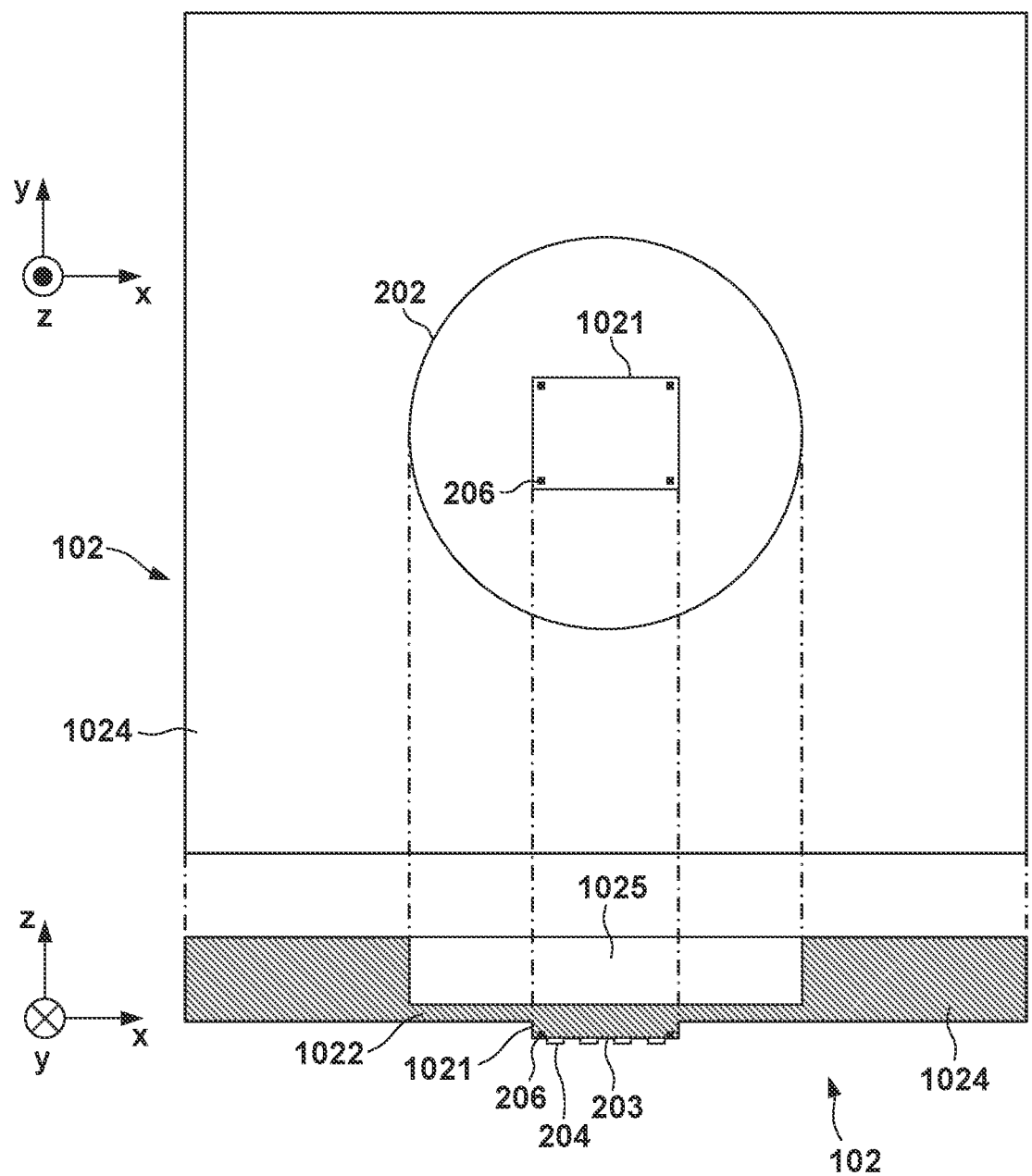
FIG. 3 is a view showing an example of the arrangement of a mold.

FIG. 3 schematically shows the arrangement of the mold 102. The mold 102 can be made of, for example, fused silica, an organic polymer, or a metal, but may be made of another material. The mold 102 can include a thin-plate movable portion (diaphragm) 1022, the pattern portion 1021 arranged so as to protrude from the movable portion 1022, and a support portion 1024 that supports the movable portion 1022. A hollow portion 1025 surrounded by the support portion 1024 can be arranged on the back-surface side (a side opposite to the side on which the pattern portion 1021 is arranged) of the movable portion 1022. The hollow portion 1025 forms a part of the aforementioned pressure chamber 133. The thickness of the movable portion 1022 can be, for example, about 1 mm. The pattern portion 1021 can have a thickness of, for example, about 30 µm. A pattern formed by convex patterns 204 and concave patterns 203 is formed on the surface of each pattern portion 1021. A step between the surface of each convex pattern 204 and the surface of the concave pattern 203, that is, the height of each convex pattern 204 can fall within the range of, for example, several ten nm to several hundred nm. The pattern portion 1021 can include one or a plurality of marks 206.

Figure 4A:
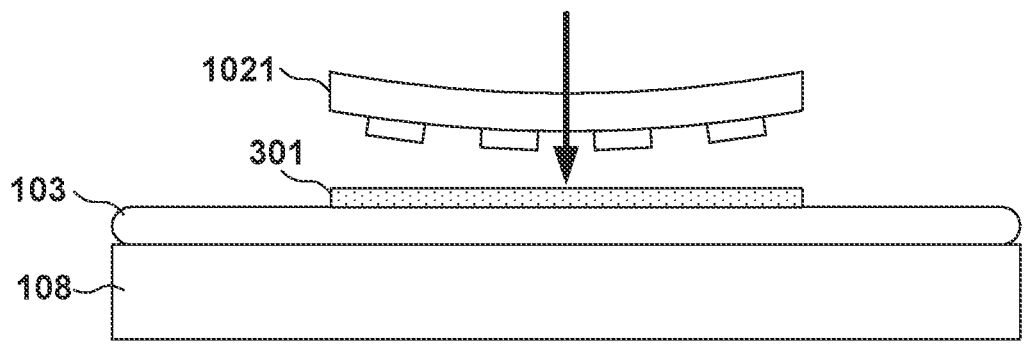
FIGS. 4A to 4D are views schematically showing a general imprint process performed by an imprint apparatus.
Figure 4B:
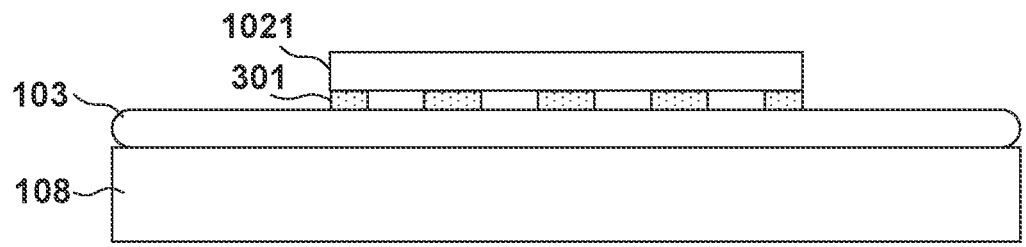

A general imprint process performed by the imprint apparatus NIL will be described with reference to FIGS. 4A to 4D. The following operation is controlled by the controller 190. Note that only the pattern portion 1021 of the mold 102 is shown as a structure above the substrate 103 in FIGS. 4A to 4D for the sake of simplicity. First, as schematically shown in FIGS. 4A and 4B, the controller 190 brings the imprint material 301 and the pattern portion 1021 into contact with each other by bringing the substrate 103 and mold 102 (pattern portion 1021) closer to each other. More specifically, the controller 190 first controls the mold driver 131 to start lowering the mold 102 in a state in which a purge gas has been supplied between the substrate 103 and the mold 102 by the gas supplier 170 as schematically shown in FIG. 4A. This brings the mold 102 closer to the imprint material 301 which has been supplied onto the shot regions on the substrate 103 by the dispenser 106. The controller 190 can cause the pressure controller 181 to control the pressure of the pressure chamber 133 here so that the mold 102 will have a convex shape (downward) toward the substrate 103 before the lowering of the mold 102 is started or in parallel with the lowering of the mold 102. Deforming the mold 102 into a target shape by the pressure controller 181 requires about several hundred msec in one example. Hence, the pressure control performed by the pressure controller 181 on the pressure chamber 133 can be started in parallel with the operation to supply the imprint material 301 onto the substrate 103 by the dispenser 106.

Next, as schematically shown in FIG. 4B, after a part of the pattern of the pattern portion 1021 of the mold 102 comes into contact with the imprint material 301, the controller 190 controls the pressure controller 181 so as to flatten the pattern portion 1021. The operation performed to bring the substrate 103 and the mold 102 close to each other can include a first operation and a second operation after the first operation. In the first operation, the substrate 103 and the mold 102 are brought closer to each other at a first speed. In the second operation, after the first operation, the substrate 103 and the mold 102 are brought closer to each other at a second speed slower than the first speed, and thus the imprint material 301 and the mold 102 come into contact with each other. As a result, a collision between the substrate 103 and (the pattern portion 1021 of) the mold 102 can be prevented. Each concave pattern of the pattern portion 1021 is filled with the imprint material 301 in a state in which the imprint material 301 is in contact with the pattern portion 1021 of the mold 102 as schematically shown in FIG. 4B.

Figure 4C:
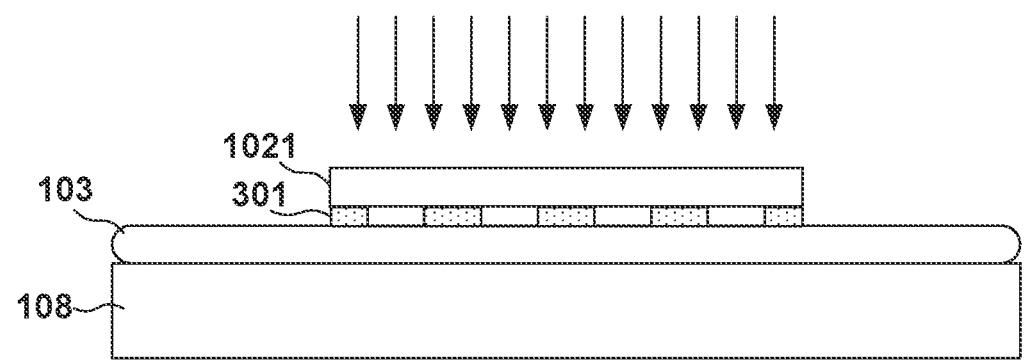
Figure 4D:
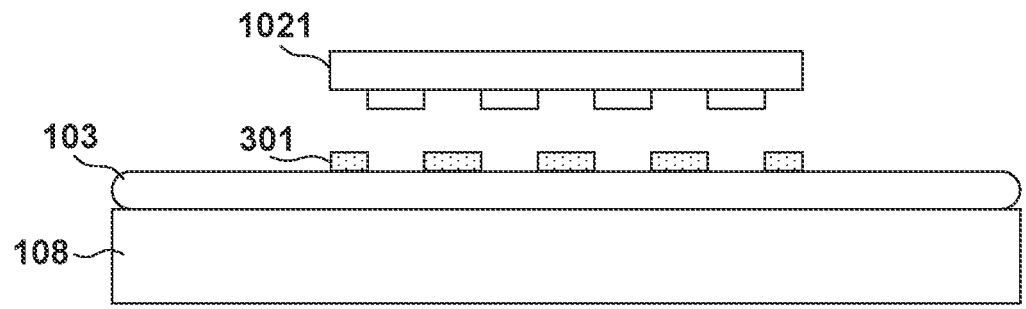

Next, as schematically shown in FIG. 4C, the controller 190 controls the curing unit 105 so that the energy (for example, light) for curing the imprint material 301 will be supplied onto the imprint material 301. As a result, the imprint material 301 is cured, and the pattern of the pattern portion 1021 is transferred to the imprint material 301. Next, as schematically shown in FIG. 4D, the controller 190 controls the mold driver 131 so that (the pattern portion 1021 of) the mold 102 will be separated from the cured imprint material 301.

Figure 5A:
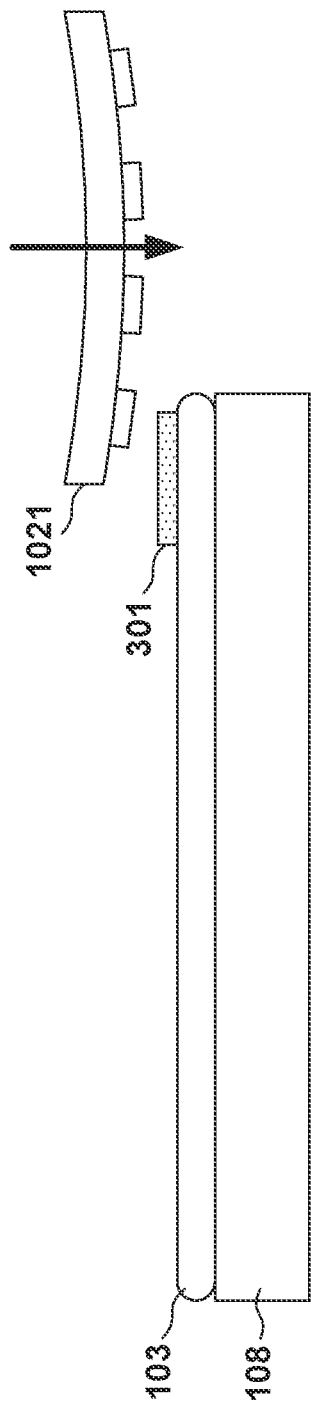
FIGS. 5A and 5B are views for explaining a problem that can occur in the general imprint process performed on a partial shot region.
Figure 5B:
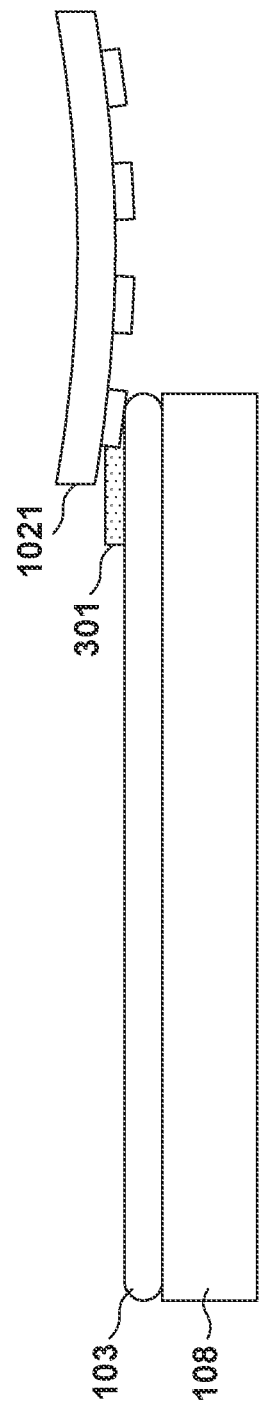

A problem that may occur in a general imprint process performed on a partial shot region (peripheral shot region) will be described with reference to FIGS. 5A and 5B. A partial shot region indicates, for example, is a region where only a part of the entire pattern of the pattern portion 1021 is transferred onto the imprint material on the substrate 103.

The partial shot region is a region which includes the periphery (edge) of the substrate 103. First, as schematically shown in FIG. 5A, the lowering of the mold 102 is started in a state in which the mold 102 is deformed to have a downward convex shape. Subsequently, at the point when the center portion (the most downward protruding portion) of the pattern portion 1021 of the mold 102 reaches a position lower than the height of the surface of the substrate 103, the peripheral portion of the pattern portion 1021 of the mold 102 can collide with the edge of the substrate 103. As a result, the mold 102 will degrade and may become damaged in some cases.

Figure 6A:
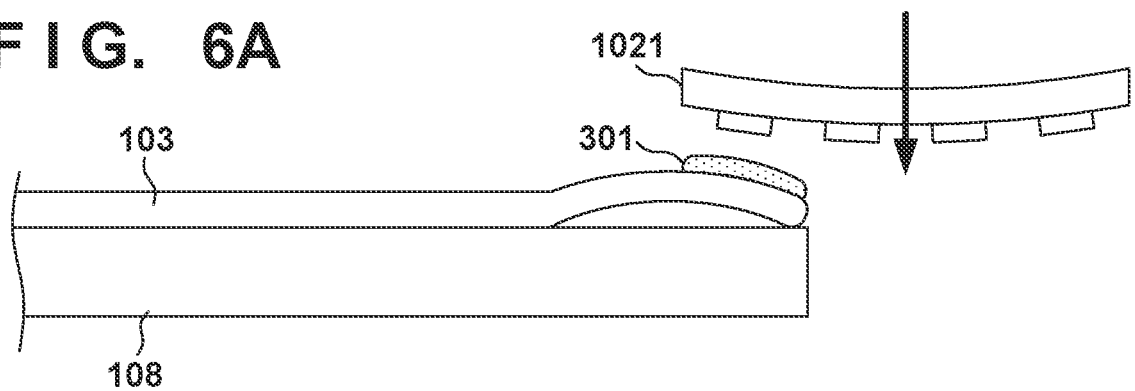
FIGS. 6A to 6D are views schematically showing an improved imprint process.
Figure 6B:
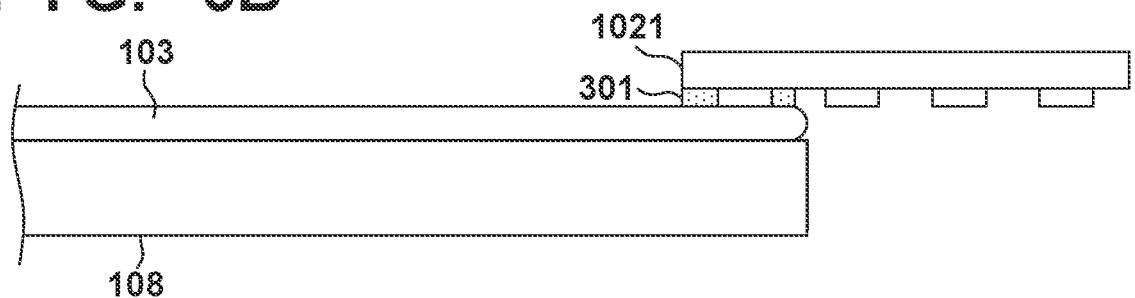

FIGS. 6A to 6D schematically show an imprint process which has been improved with respect to the problem described with reference to FIGS. 5A and 5B. The improved imprint process will be described hereinafter with reference to FIGS. 6A to 6D. First, as schematically shown in FIGS. 6A and 6B, the controller 190 brings the pattern portion 1021 and the imprint material 301 into contact by bringing the substrate 103 and (pattern portion 1021 of) the mold 102 closer to each other. More specifically, as schematically shown in FIG. 6A, the controller 190 first causes the mold deformation mechanism 180 to control the shape of the mold 102 so that the mold 102 will have a convex shape toward (downward) to the substrate 103. Deforming the mold 102 into a target shape by the mold deformation mechanism 180 requires about several hundred msec in one example. Hence, the pressure control performed by the pressure controller 181 on the pressure chamber 133 can be started in parallel with the operation to supply the imprint material 301 onto the substrate 103 by the dispenser 106.

In addition, the controller 190 controls, in parallel to the deformation of the mold 102 described above, the shape of the substrate 103 by the substrate deformation mechanism CDM so that the substrate 103 will have a convex shape (upward) toward the mold 102 as schematically shown in FIG. 6A. The controller 190 also controls the mold driver 131 to start the lowering of the mold 102 in a state in which a purge gas has been supplied to a space between the mold 102 and the substrate 103 by the gas supplier 170. As a result, the mold 102 becomes closer to the imprint material 301 supplied onto the shot regions of the substrate 103 by the dispenser 106. Next, as schematically shown in FIG. 6B, the controller 190 controls the substrate deformation mechanism CDM so that the pattern portion 1021 will be flattened once a part of the pattern of the pattern portion 1021 of the mold 102 has come into contact with the imprint material 301. By controlling the surface shape of the substrate 103 so that the substrate 103 will have a convex shape (upward) toward the mold 102, it becomes possible to prevent a collision between the edge of the substrate 103 and the mold 102 even in a case in which an imprint process is to be performed in a partial shot region, and thus the degradation of the mold 102 can be reduced.

An operation to bring the substrate 103 and the mold 102 closer to each other can include a first operation and a second operation performed after the first operation. In the first operation, the substrate 103 and the mold 102 are brought closer to each other at a first speed. In the second operation, the substrate 103 and the mold 102 are brought closer to each other at second speed slower than the first speed after the first operation, and the imprint material 301 and the mold 102 come into contact with each other. As a result, a collision between the substrate 103 and (the pattern portion 1021 of) the mold 102 can be prevented. Each concave pattern on the pattern portion 1021 is filled with the imprint material 301 in a state in which the pattern portion 1021 of the mold 102 is in contact with the imprint material 301 as schematically shown in FIG. 6B.

Figure 6C:
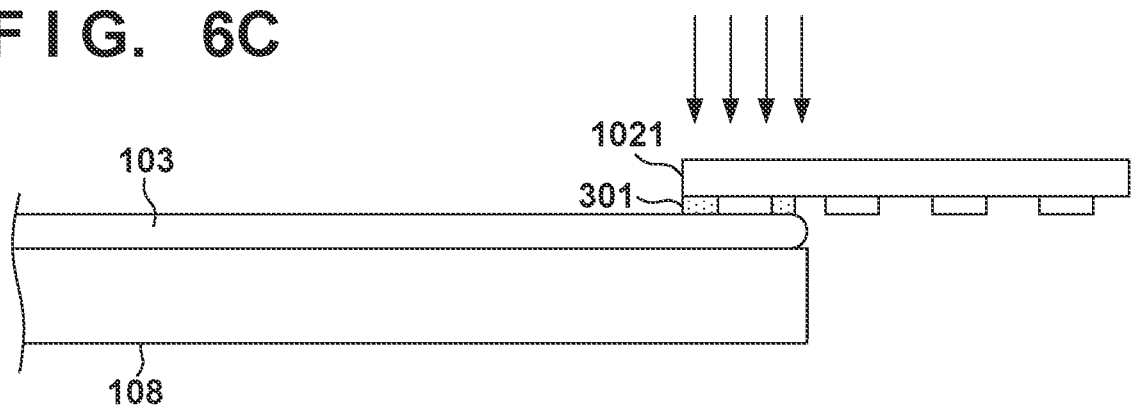
Figure 6D:
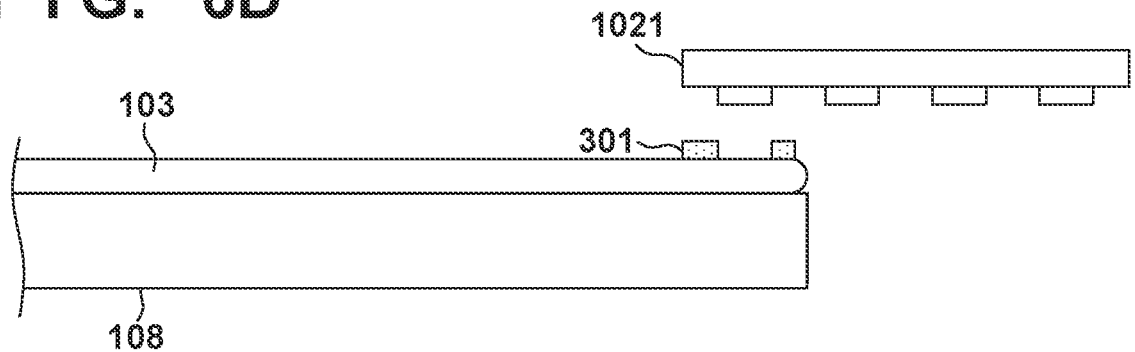

Next, as schematically shown in FIG. 6C, the controller 190 controls the curing unit 105 so that the energy (for example, light) for curing the imprint material 301 is applied to the imprint material 301. As a result, the imprint material 301 is cured, and a pattern on the pattern portion 1021 is transferred to the imprint material 301. Next, as schematically shown in FIG. 6D, the controller 190 controls the mold driver 131 so that (the pattern portion 1021 of) the mold 102 will be separated from the cured imprint material 301.

As described above, the imprint process exemplified in FIGS. 6A to 6D has been improved to reduce the degradation of the mold 102. However, the imprint process exemplified in FIGS. 6A to 6D does not consider how the deflection amount of the substrate can vary in a non-uniform manner in a circumferential direction of the substrate 103 based on the crystal orientation of the substrate 103. Hence, the possibility of the degradation of the mold 102 remains in the imprint process exemplified in FIGS. 6A to 6D.

Figure 7A:
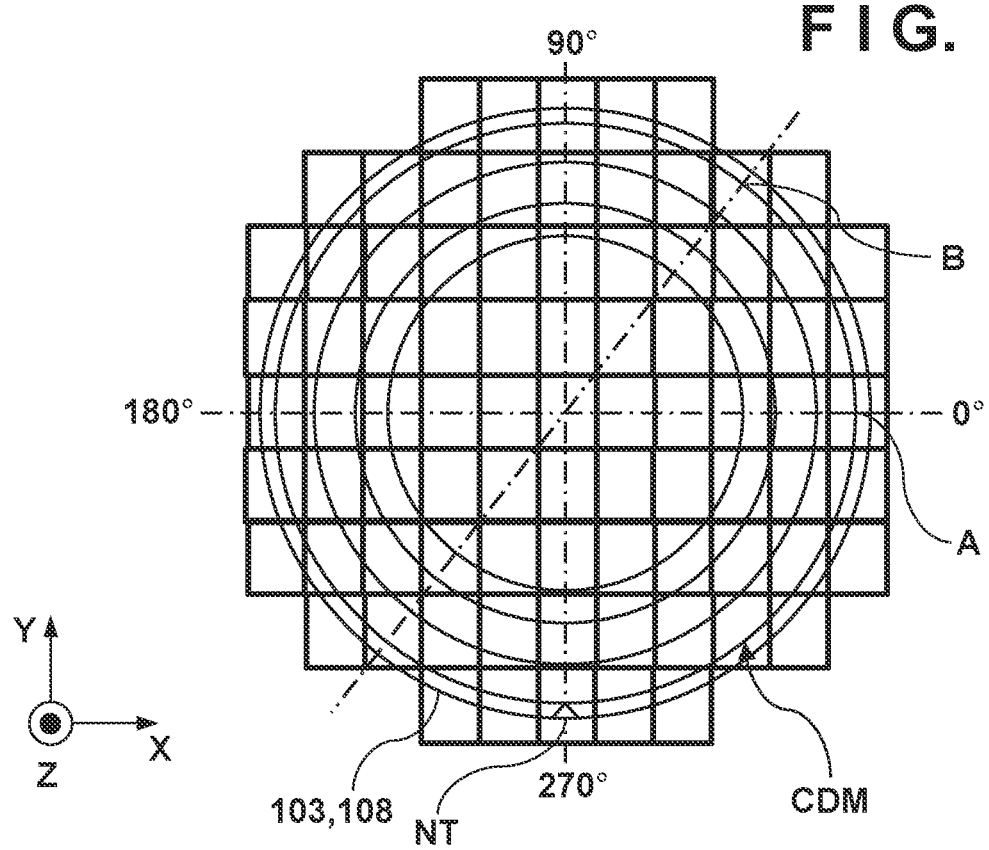
FIGS. 7A and 7B are views for explaining problematic points in the improved imprint process.

A state in which the deflection amount becomes non-uniform in the circumferential direction of the substrate 103 will be described with reference to FIGS. 7A and 7B hereinafter. FIG. 7A shows a substrate holder 108 and a substrate 103 with a notch NT together with the substrate deformation mechanism CDM. The notch NT is a mark indicating the crystal orientation of the substrate 103. An orientation flat may be arranged as a mark indicating the crystal orientation of the substrate 103 instead of the notch. A mark provides the orientation information indicating the crystal orientation of the substrate 103. The orientation information may be provided to the controller 190 by other than a mark. In the example shown in FIG. 7A, the positive direction of the X-axis of the X-Y coordinate system is set as the orientation=0°, and the substrate 103 is arranged on the substrate holder 108 by a conveyance mechanism (not shown) so that the notch NT will face an orientation of 270°.

In addition, in FIG. 7A, a thick line indicates the shot layout (shot region arrangement) of the substrate 103. Each rectangle indicates a shot region. Each shot region whose entire rectangle is contained inside the substrate 103 is a full shot region to which the entire pattern of the pattern portion 1021 of the mold 102 can be transferred. Each shot region whose rectangle is cut across by the edge of the substrate 103 is a partial shot region. Note that although each partial shot region is shown to have a rectangular shape in FIG. 7A, a part of the outer shape of the partial shot region is set along the edge of the substrate 103. Typically, in a shot layout that includes partial shot regions, each full shot region is defined to include a plurality of chip regions, and each partial shot region is defined to include at least one chip region. In FIG. 7A, reference symbols A and B indicate partial shot regions.

Figure 7B:
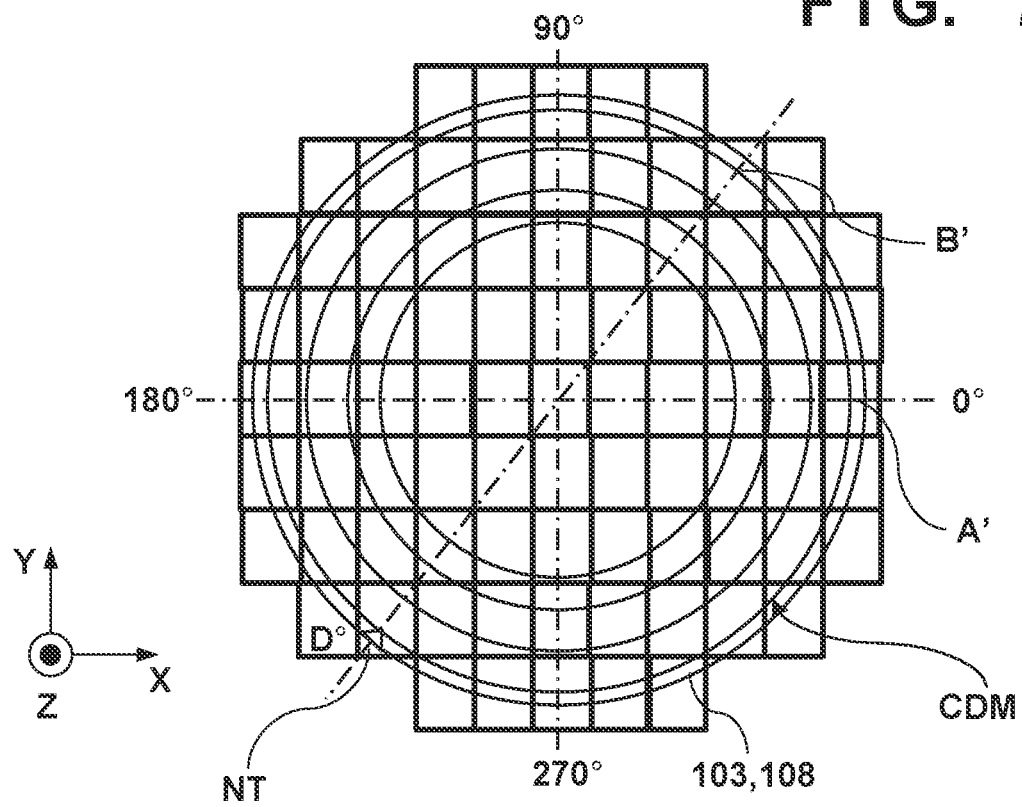

FIG. 7B also shows a substrate 103 with the notch NT and the substrate holder 108 together with the substrate deformation mechanism CDM. In the example shown in FIG. 7B, the substrate 103 is arranged on the substrate holder 108 by the conveyance mechanism (not shown) so that the notch NT will face an orientation of D°. Partial shot regions A' and B' are present at the same positions as the partial shot regions A and B, respectively, shown in FIG. 7A. That is, the difference between the state shown in FIG. 7A and the state shown in FIG. 7B is only the orientation (position) of the notch NT indicating the crystal orientation of the substrate 103.

Figure 8A:
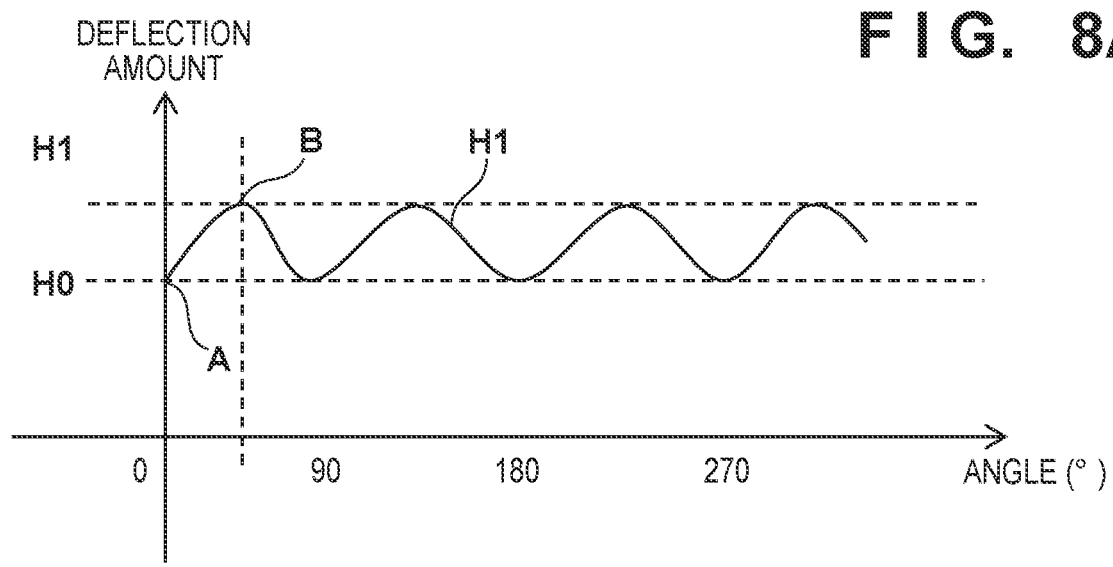
FIGS. 8A to 8C are views showing examples of results obtained by measuring peripheral region deflection amounts in a substrate around the entire substrate.

FIG. 8A exemplifies a result obtained by measuring a deflection amount H1 in the peripheral region of the substrate 103 over the whole circumference of the substrate 103 while constantly maintaining, by the substrate deformation mechanism CDM, the deformation state of the substrate 103 arranged on the substrate holder 108 in the orientation shown in FIG. 7A. In FIG. 8A, a reference symbol A indicates the deflection amount at a point (for example, a position where a straight line connecting the center of a rectangle indicating the partial shot region A and the center of the substrate 103 intersects with the edge of an effective region of the substrate 103) in the partial shot region A. In the same manner, in FIG. 8A, a reference symbol B indicates the deflection amount at a point (for example, a position where a straight line connecting the center of a rectangle indicating the partial shot region B and the center of the substrate 103 intersects with the edge of an effective region of the substrate 103) in the partial shot region B.

Figure 8B:
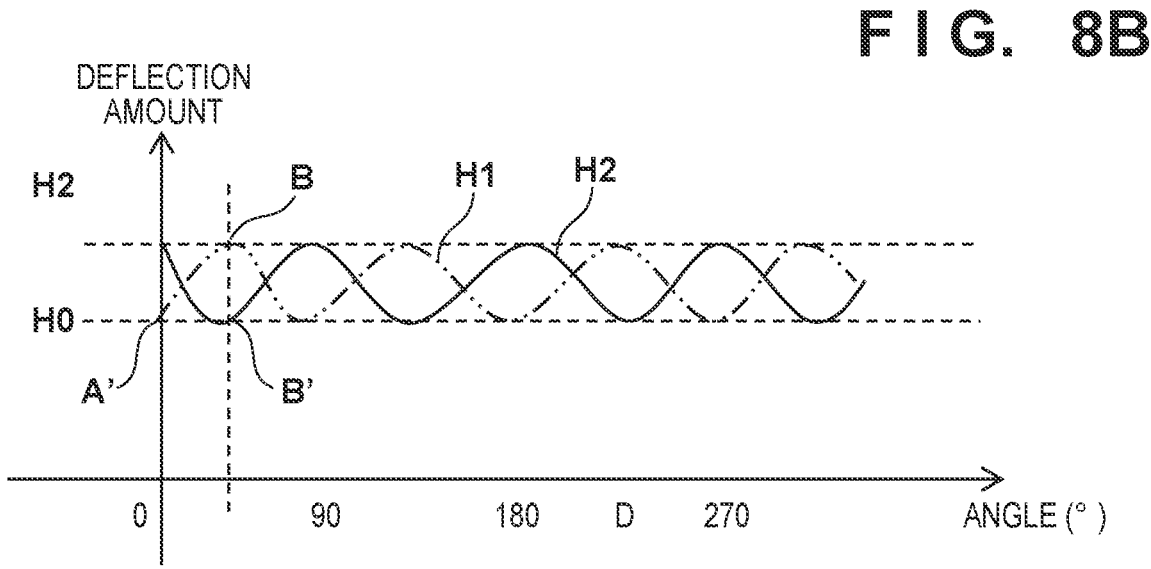

In FIG. 8B, a solid line indicates a result obtained by measuring a deflection amount H2 in the peripheral region of the substrate 103 over the whole circumference of the substrate 103 while constantly maintaining, by the substrate deformation mechanism CDM, the deformation state of the substrate 103 arranged on the substrate holder 108 in the orientation shown in FIG. 7B. In addition, in FIG. 8B, the deflection amount H1 of FIG. 8A is shown by dotted lines for the sake of reference. In FIG. 8B, a reference symbol A' indicates the deflection amount at a point (for example, a position where a straight line connecting the center of a rectangle indicating the partial shot region A' and the center of the substrate 103 intersects with the edge of an effective region of the substrate 103) in the partial shot region A'. In the same manner, in FIG. 8B, a reference symbol B' indicates the deflection amount at a point (for example, a position where a straight line connecting the center of a rectangle indicating the partial shot region B' and the center of the substrate 103 intersects with the edge of an effective region of the substrate 103) in the partial shot region B'. In this case, as described above, the shot region A and the shot region A' are at the same position as each other in the imprint apparatus NIL.

In FIGS. 8A and 8B, letting the positive direction of the X-axis be an orientation=0°, the abscissa represents an angle indicating the orientation, and the ordinate represents the deflection amount. The deflection amount is a difference between the height of an evaluation point before the deformation of the substrate 103 and the height of the evaluation point after the deformation. An evaluation point is a position on the surface of the substrate 103 to be measured by the substrate measuring device 109, and for example, evaluation points are arranged at a plurality of positions in the peripheral region of the substrate 103. Suitable control conditions of the substrate deformation mechanism CDM can differ between a case in which an imprint process is to be performed on the shot region A in the substrate 103 arranged as shown in FIG. 7A and a case in which an imprint process is to be performed on the shot region A' in the substrate 103 arranged as shown in FIG. 7B. This is because the deflection amount of the substrate 103 at the position of the shot region A in the substrate 103 arranged as shown in FIG. 7A and the deflection amount of the substrate 103 at the position of the shot region A' in the substrate 103 arranged as shown in FIG. 7B are different. If the control conditions of the substrate deformation mechanism CDM at the imprint process on the shot region A and that at the imprint process on the shot region A' are the same, the height of the mold 102 at the timing where the imprint material 301 and the pattern portion 1021 of the mold 102 come into contact with each other can differ between the shot region A and the shot region A'.

However, the present inventor has found that the deflection amount of the substrate 103 on the circumference (for example, the edge of the effective region of the substrate 103) about the center of the substrate 103 periodically changes along the circumference as exemplified in FIGS. 8A and 8B. In addition, the present inventor has found that a phase in this periodic change is strongly correlated with the orientation of the notch NT, and that the change curve of the deflection amount H1 in FIG. 8A and the change curve of the deflection amount H2 in FIG. 8B have a phase difference corresponding to the difference in the orientation of the notch NT. This fact strongly suggests that the deflection amount is caused by the crystal orientation of the substrate 103. To offer a simplified explanation of this phenomenon, the rigidity in a given direction of the substrate 103 depends on an angle difference between this direction and the crystal orientation.

As described above, if information (to be referred to as characteristic information hereinafter) indicating the change in the deflection amount of the substrate on the circumference about the center of the substrate can be obtained in advance, the deflection amount of the substrate 103 can be specified based on the characteristic information and the orientation of the notch NT on the substrate 103 arranged on the substrate holder 108. For example, if the characteristic information as shown in FIG. 8A can be obtained in advance, the deflection amount of the substrate 103 at an arbitrary position on the circumference about the center of the substrate 103 arranged on the substrate holder 108 can be specified based on the orientation of the notch NT of the substrate 103.

Hence, the deflection amount of a target shot region can be specified based on the characteristic information and a difference between the orientation of the notch NT of the substrate 103 in a state in which the substrate is arranged on the substrate holder 108 and the orientation of the notch NT of the substrate 103 at the time of the obtainment of the characteristic information. For example, if the characteristic information exemplified in FIG. 8A is the characteristic information obtained in advance, the difference between the direction of the notch NT at the obtainment of the characteristic information and the difference in the orientation of the notch NT of the substrate 103 arranged as shown in FIG. 7B is 270°-D°. Characteristic information as shown in FIG. 8B can be easily calculated by shifting the phase of the characteristic information exemplified in FIG. 8A by this difference.

Furthermore, if it is possible to specify the deflection amount of the substrate 103 at an arbitrary position on the circumference, the control information of the substrate deformation mechanism CDM to be set for an imprint process to be performed on each shot region on the circumference can be determined based on the deflection amount.

Based on the principal described above, the controller 190 generates corrected control information for performing an imprint process on a target shot region by correcting the reference control information for controlling the substrate deformation mechanism CDM. In addition, the controller 190 controls the substrate deformation mechanism CDM in the imprint process of the target shot region in accordance with the corrected control information. The controller 190 here can generate the corrected control information by correcting the reference control information based on the position of the notch NT of the substrate 103 in a state in which the substrate 103 is held by the substrate holder 108 and the position of the target shot region on the substrate 103 in this state. The reference control information and the corrected control information are, for example, pieces of information used to control the pressure controller 150 to control the pressure applied to each of the plurality of concave portions 121 to 125 of the substrate deformation mechanism CDM.

Figure 8C:
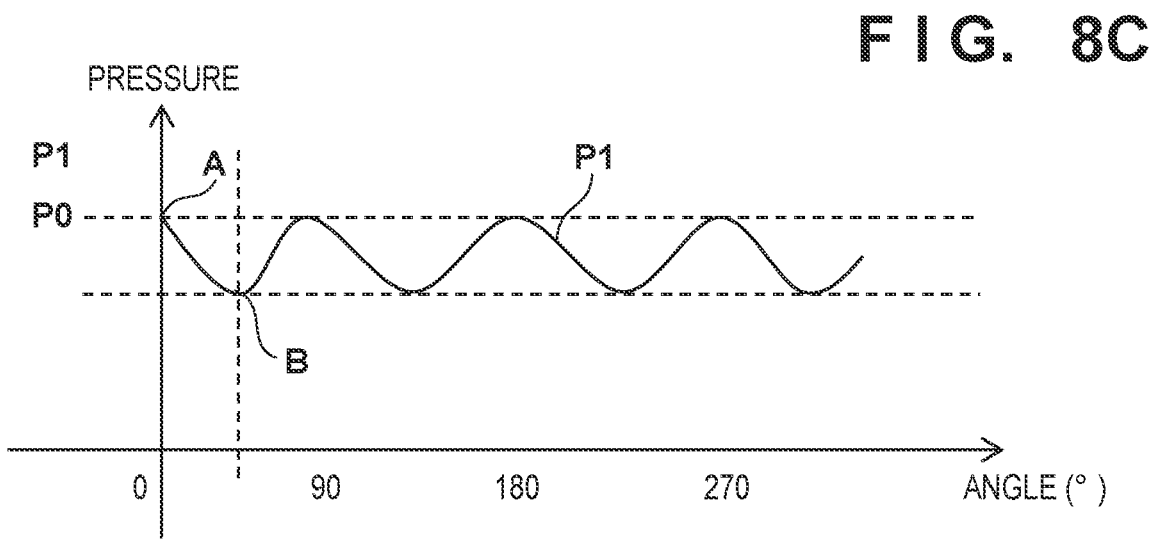

The relationship between the periodicity of the deflection amount and the corrected control information considering this will be exemplified hereinafter. FIG. 8C exemplifies pressure control information as a piece of control information for controlling the substrate deformation mechanism CDM so the deflection amount H1 shown in FIG. 8A will be a target deflection amount. It has been confirmed by an experiment that the deflection amount H1 can be approximately provided by a function which uses the orientation (angle) indicating a position on the substrate 103 as a variable, more specifically, a periodic function such as H1=H0+AMH×|sin2(θ+α)|, where H0 is a deflection amount obtained at a position (orientation) where the deflection amount of the substrate 103 is smallest, AMR is a coefficient, and H0+AMH is the deflection amount obtained at a position (orientation) where the deflection amount is largest, θ is an orientation (angle with respect to the X-axis as a reference) indicating a position (shot region position) on the substrate 103, and α is a difference (an angle difference or a phase difference) between the orientation of the notch NT of a test substrate in a measurement mode (to be described later) and the orientation of the notch NT of the substrate 103 when an imprint process is to be performed. The measurement mode is executed in the arrangement shown in FIG. 7A, and if an imprint process is to be executed in the arrangement shown in FIG. 7B, α=(270−D)°.

A pressure value P1 as the pressure control information can be approximately provided by a function using an orientation (angle) indicating a position on the substrate 103, more specifically, a periodic function such as P1=P0−AMP×|cos2(θ+α)|, where P0 is a pressure value to make the deflection amount, obtained at a position (orientation) where the deflection amount of the substrate 103 is smallest, match a target deflection amount, AMP is a coefficient, and P0−AMP is a pressure value to make the deflection amount, obtained at a position (orientation) where the deflection amount of the substrate 103 is largest, match a target deflection amount. The coefficient AMP can be determined by obtaining, for example, the relationship between the pressure value and the deflection amount at the measurement of the deflection amount in the measurement mode (to be described later). Alternatively, the coefficient AMP can be determined by simulation or the like.

The above description which has been given with reference to FIGS. 7A, 7B, and 8A to 8C is related to the peripheral region of the substrate 103, that is, the region where partial shot regions are arranged. However, the periodic change in the deflection amount depending on the crystal orientation can be present in a region (that is, a region where full shot regions are arranged) on the inner side with respect to the peripheral region. Therefore, the above description is applicable to a region on the inner side with respect to the peripheral region of the substrate 103. In this case, the function indicating the deflection amount and the function indicating the pressure value can be determined for each of the plurality of radii indicating the radial direction positions in the substrate 103.

The pressure value required to deform the substrate 103, so the height of the shot region will be a target height when the mold 102 is to be brought into contact with the imprint material 301 on the shot region substrate 103, can be determined in the measurement mode executed before the execution of the imprint process. Alternatively, the pressure value may be measured and adjusted at each imprint process. However, this can reduce the throughput. The former method will be exemplified hereinafter.

Figure 9:
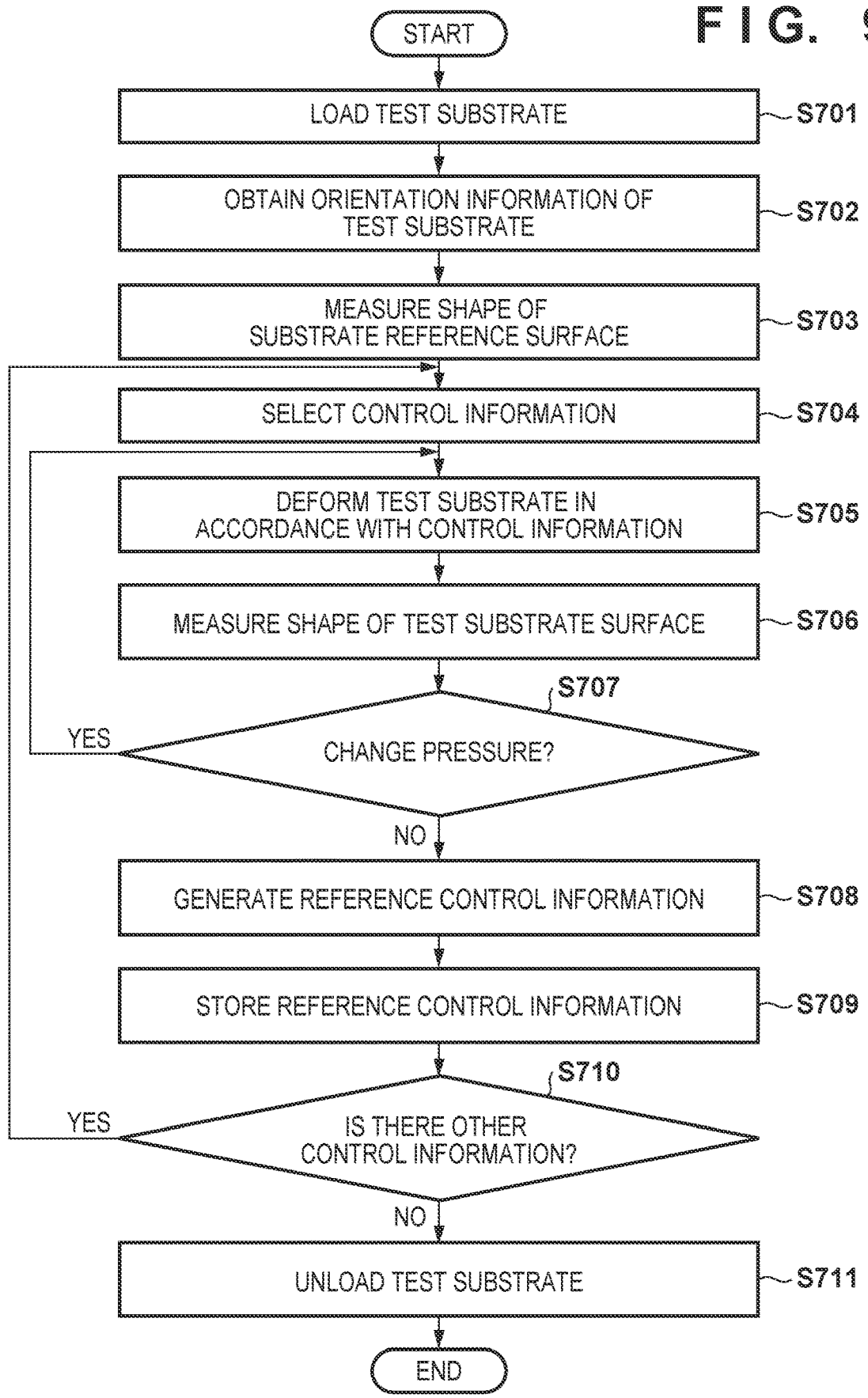
FIG. 9 is a flowchart illustrating an example of a measurement mode operation in the imprint apparatus according to the embodiment of the present invention.

FIG. 9 is a flowchart illustrating the operation of the imprint apparatus NIL in the measurement mode. In the measurement mode, the pressure value required to deform the substrate 103 so the height of each shot region will be a target height when the mold 102 is brought into contact with the imprint material 301 on the shot region of the substrate 103 will be determined. The controller 190 controls the operation of the imprint apparatus NIL in the measurement mode. In step S701, the conveyance mechanism (not shown) loads a test substrate onto the substrate holder 108. The test substrate in this case may be a substrate for manufacturing an article, that is, a substrate to be processed in a manufacturing mode (to be described later) or may be a substrate for testing purposes.

In step S702, the controller 190 obtains the information indicating the orientation of the notch NT of the test substrate loaded (arranged) on the substrate holder 108. This information can be obtained, for example, based on information (information designating the orientation of the notch NT) provided to a pre-alignment apparatus for executing a pre-alignment operation on the test substrate.

In step S703, while controlling the substrate deformation mechanism CDM so the test substrate will be held in a flat state by the substrate deformation mechanism CDM, the controller 190 causes the substrate measuring device 109 to measure the height of the surface of the test substrate at each of a plurality of positions on the test substrate. As a result, the shape of the surface (to be referred to as a substrate reference surface hereinafter) of the test substrate in a state in which the test substrate is held flat will be measured. Normally, the test substrate will be held flat by causing all of the concave portions 121 to 125 of the substrate deformation mechanism CDM to be set to a negative pressure sufficient for chucking the substrate 103.

In step S704, the controller 190 selects one piece of the plurality of pieces of control information for controlling the substrate deformation mechanism CDM. A piece of control information here is information used to control the pressure controller 150 for controlling the pressure of each of the plurality of concave portions 121 to 125 of the substrate deformation mechanism CDM in accordance with the position of each shot region. At least one piece of the plurality of pieces of control information can include first control information for controlling the substrate deformation mechanism CDM for performing an imprint process on a partial shot region (peripheral region of the substrate). The first control information can be, for example, information to instruct the pressure controller 150 to apply a negative pressure to each of the concave portions 121, 123, 124, and 125 and to apply a positive pressure to the concave portion 122.

In step S705, the controller 190 deforms the test substrate by controlling the pressure controller 150 of the substrate deformation mechanism CDM in accordance with the control information selected in step S704. At this time, at least one of the plurality of concave portions 121 to 125 can be controlled to be applied with the positive pressure designated by the control information.

In step S706, the controller 190 causes the substrate measuring device 109 to measure the height of the surface of the test substrate at the plurality of positions on the test substrate. As a result, the substrate measuring device measures the shape of the surface of the test substrate whose deformation has been controlled in accordance with the control information. In step S707, the controller 190 determines whether the measurement for deforming the substrate 103 so the height of each shot region designated in advance will be a target height has been completed. If the measurement has not been completed, the pressure value is changed and the processes of steps S705 and S706 are repeated. If the measurement for deforming the substrate 103 so the height of each shot region designated in advance will be a target height has been completed, the controller 190 causes the process to advance to step S708. For example, the pressure value can be changed so that the height (deflection amount) of the peripheral region of the test substrate will be changed in a case in which the control information selected in step S704 is the first control information.

In step S708, the controller 190 generates, based on the measurement result obtained in step S706, reference control information indicating the relationship between a position (orientation) on the test substrate and a pressure value for setting a deflection amount (height) at the position to the target deflection amount (target height). The reference control information can be generated in a format such as, for example, the aforementioned $P1=P0-AMP\times\cos2(\theta+\alpha)|$, $\alpha=0°$, and orientation=270°. In step S709, the controller 190 stores the reference control information generated in step S708.

In step S710, the controller 190 determines whether the processes of steps S704 to S709 have been executed for every piece of the plurality of pieces of control information. If there is a piece of control information on which the processes have not been executed, the process returns to step S703. Otherwise, the process advances to step S711.

In step S711, the conveyance mechanism (not shown) unloads the test substrate from the substrate holder 108. By the execution of the operation described above, a plurality of pieces of pressure information are stored in association with the plurality of pieces of control information.

Figure 10:
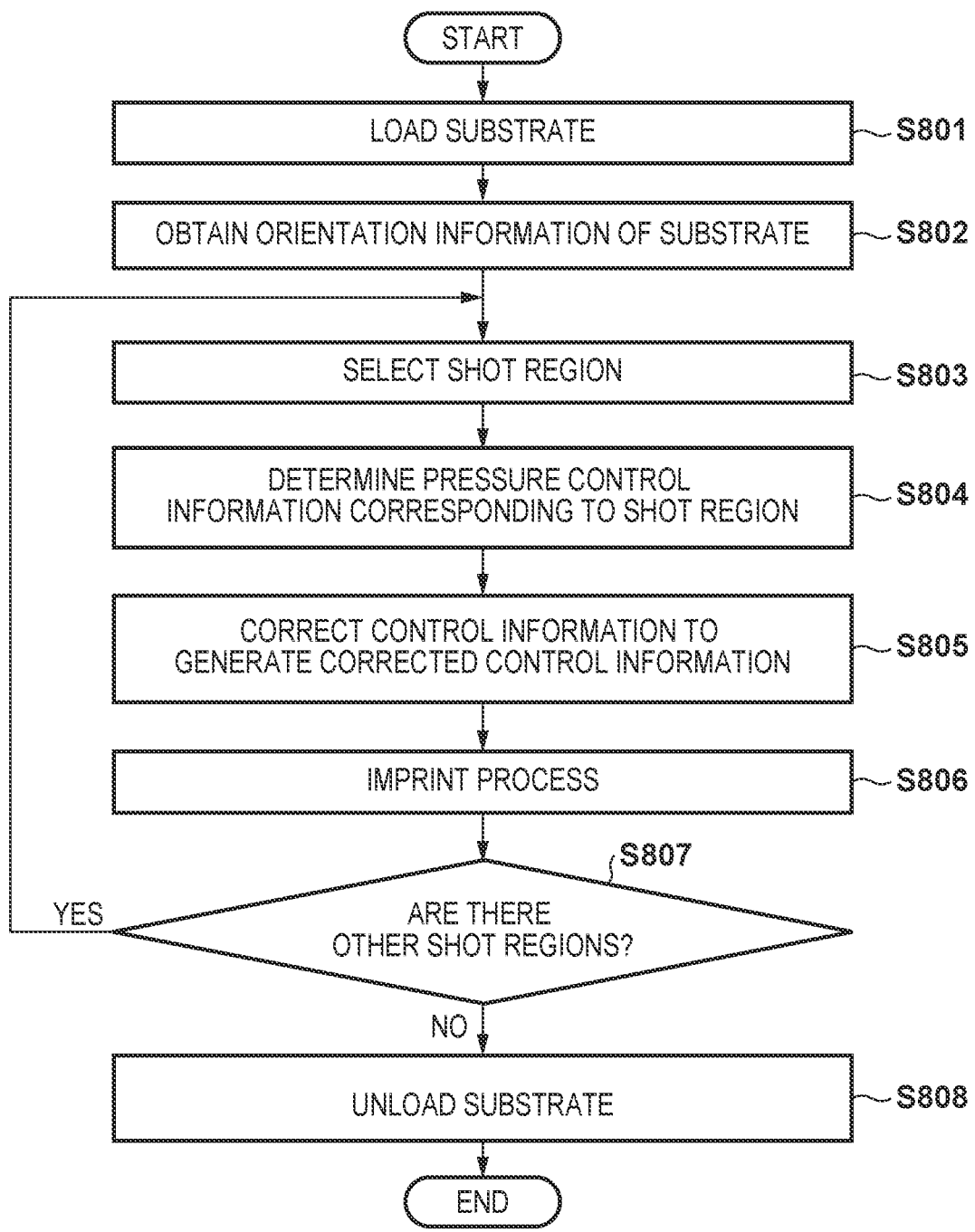
FIG. 10 is a flowchart illustrating an example of a manufacturing mode operation in the imprint apparatus according to the embodiment of the present invention.

FIG. 10 is a flowchart illustrating the operation of the imprint apparatus NIL in the manufacturing mode. In the manufacturing mode, an imprint process is performed on each shot region of the substrate 103 for manufacturing an article. The controller 190 controls the operation of the manufacturing mode. In step S801, the conveyance mechanism (not shown) loads the substrate 103 onto the substrate holder 108. In step S802, the controller 190 obtains the orientation information indicating the orientation of the notch NT of the substrate 103 loaded (arranged) on the substrate holder 108. This orientation information can be obtained based on the information (information designating the direction of the notch NT) provided to the pre-alignment apparatus that performs the pre-alignment operation on the substrate 103. For example, the user can designate the orientation of the notch NT of the substrate 103 when the substrate 103 is to be arranged on the substrate holder 108. The crystal orientation of the substrate 103 can influence, for example, the characteristics of a semiconductor element (for example, a transistor) to be formed. The user can determine the orientation of the notch NT in accordance with the specification required for the article to be manufactured.

In step S803, the controller 190 determines a shot region (can be referred to as a target shot region or a shot region on which the imprint process is to be executed next) on which the imprint process is to be performed among the plurality of shot regions on the substrate 103. In step S804, the controller 190 obtains the reference control information for controlling the substrate deformation mechanism CDM. The reference control information can be obtained by selecting a piece of reference control information corresponding to the shot region determined in step S803 from the one piece of or the plurality of pieces of reference control information stored in step S709 in the measurement mode.

In the above description, in step S803, after the imprint process (from the contact operation to the separation operation) on one shot region has been completed, another shot region which is to undergo the imprint process next is set as the processing target region. However, two or more shot regions may be set as the processing target regions. That is, instead of setting a processing target region for each shot region one by one, two or more shot regions can be set as the processing target regions, and the controller may obtain reference control information so that a warp amount (deformation amount) corresponding to two or more shot regions will be suppressed to be equal to or less than a threshold. However, it may be undesirable to set one piece of reference control information for one substrate. It is desirable for the number of pieces of reference control information to be at least four (preferably, at least eight) and to be equal to or less than (preferably, equal to or less than twenty) the number of shot regions for one substrate. Alternatively, for one substrate, it is desirable to obtain pieces of reference control information that are equal to or more than 1/50 (or equal to or more than 1/30) of the number of shot regions (including partial shot regions) on the substrate and equal to or less than the number of shot regions (preferably equal to or less than 1/30 of the number of the shot regions).

In step S805, based on the orientation information obtained in step S802, the controller 190 generates corrected control information by correcting the reference control information obtained in step S804. The corrected control information can be generated in a format, for example, such as $P1=P0-AMP\times\cos2(\theta+\alpha)|(\alpha=(270-225)°$. Hence, the deflection of the substrate 103 need not be measured even in a case in which the orientation of the processing target substrate 103 arranged on the substrate holder 108 is different from the orientation of the test substrate used when the reference control information was generated.

Note that in a case in which the height of the substrate reference surface of the processing target substrate 103 is different from that of the substrate reference surface of the test surface, the corrected control information can be corrected accordingly. The correction can be made, for example, based on the correction information indicating the relationship between the thickness of the substrate and a correction value. The correction information may be prepared in advance or may be information obtained by deforming the processing target substrate 103 and measuring the deformation amount of the substrate 103 at least one position. Alternatively, the correction may be made by another method.

In step S806, the controller 190 controls the components related to the imprint process so the imprint process is performed on the target shot region. At this time, the controller 190 controls the substrate deformation mechanism CDM based on the corrected control information generated in step S805.

In step S807, the controller 190 determines whether there is a shot region that has not been processed. If there is a shot region that has not been processed, the process returns to step S803. Otherwise, the process advances to step S808. In step S808, the conveyance mechanism (not shown) unloads the substrate 103 from the substrate holder 108.

The controller 190 can be formed, for example, a PLD (the abbreviation of a Programmable Logic Device) such as an FPGA (the abbreviation of a Field Programmable Gate Array), an ASIC (the abbreviation of an Application Specific Integrated Circuit), a general purpose computer embedded with a program, or a combination of all or some of these components.

The pattern of a cured product formed using the imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

Figure 11A:
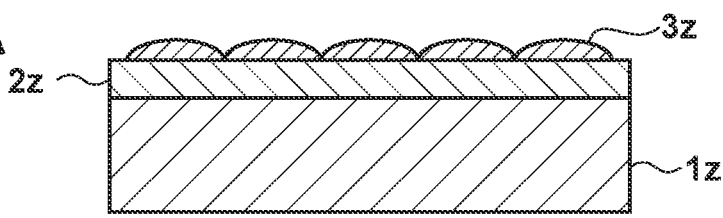
FIGS. 11A to 11F are views showing an example of an article manufacturing method.

An article manufacturing method of forming a pattern on a substrate by an imprint apparatus, processing the substrate on which the pattern has been formed, and manufacturing an article from the processed substrate will be described next. As shown in FIG. 11A, a substrate 1z such as a silicon wafer with a processed material 2z such as an insulator formed on the surface is prepared. Next, an imprint material 3z is applied to the surface of the processed material 2z by an inkjet method or the like. A state in which the imprint material 3z is applied as a plurality of droplets onto the substrate is shown here.

Figure 11B:
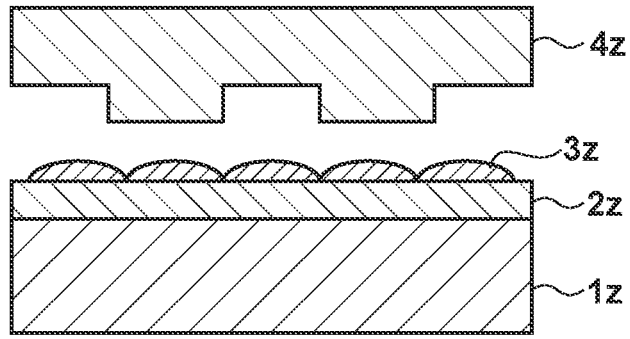
Figure 11C:
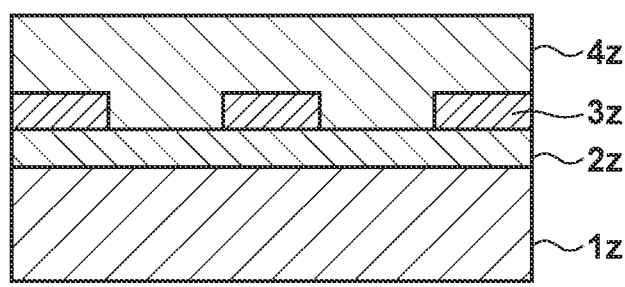

As shown in FIG. 11B, a side of a mold 4z for imprint with an uneven pattern is directed to and caused to face the imprint material 3z on the substrate. As shown in FIG. 11C, the substrate 1z to which the imprint material 3z is applied is brought into contact with the mold 4z, and a pressure is applied. The gap between the mold 4z and the processed material 2z is filled with the imprint material 3z. In this state, when the imprint material 3z is irradiated with energy for curing via the mold 4z, the imprint material 3z is cured.

Figure 11D:
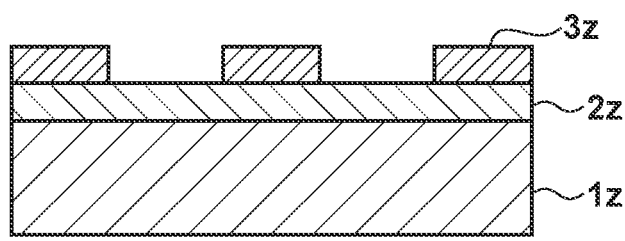

As shown in FIG. 11D, after the imprint material 3z is cured, the mold 4z is separated from the substrate 1z. Then, the pattern of the cured product of the imprint material 3z is formed on the substrate 1z. In the pattern of the cured product, the concave portion of the mold corresponds to the convex portion of the cured product, and the convex portion of the mold corresponds to the concave portion of the cured product. That is, the uneven pattern of the mold 4z is transferred to the imprint material 3z.

Figure 11E:
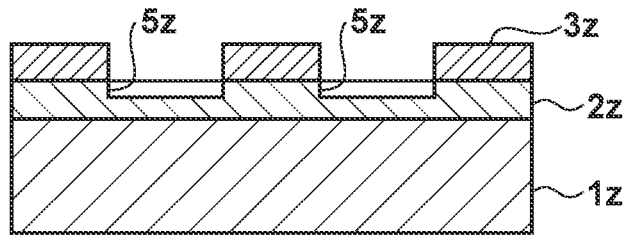
Figure 11F:
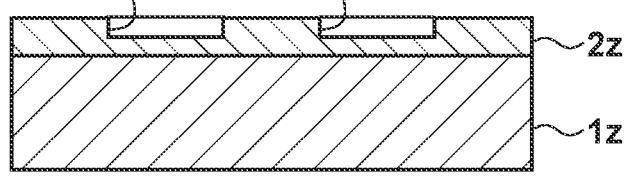

As shown in FIG. 11E, when etching is performed using the pattern of the cured product as an etching resistant mask, a portion of the surface of the processed material 2z where the cured product does not exist or remains thin is removed to form a groove 5z. As shown in FIG. 11F, when the pattern of the cured product is removed, an article with the grooves 5z formed in the surface of the processed material 2z can be obtained. Here, the pattern of the cured product is removed. However, instead of processing or removing the pattern of the cured product, it may be used as, for example, an interlayer dielectric film included in a semiconductor element or the like, that is, a constituent member of an article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)TM), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-074042, filed Apr. 6, 2018, which is hereby incorporated by reference herein in its entirety.

What is claimed is:

1. An imprint apparatus that performs an imprint process to form a pattern of a cured product of an imprint material on a substrate by using a mold, the apparatus comprising:
a substrate holder configured to hold the substrate;
a substrate deformation mechanism configured to deform the substrate so the substrate will have a convex shape toward the mold in a state in which the substrate is held by the substrate holder; and
a controller configured to control the deformation of the substrate by the substrate deformation mechanism in accordance with orientation information related to a crystal orientation of the substrate and a target shot region on which the imprint process is to be performed among a plurality of shot regions on the substrate.

2. The apparatus according to claim 1, wherein the substrate holder includes the substrate deformation mechanism.

3. The apparatus according to claim 1, wherein in a case in which the imprint process is to be performed on a second shot region among the plurality of shot regions without performing the imprint process on another shot region among the plurality of shot regions after the imprint process is performed on a first shot region among the plurality of shot regions, the controller will execute deformation control, which corresponds to the second shot region, on the substrate by the substrate deformation mechanism after the imprint process is performed on the first shot region.

4. The apparatus according to claim 1, wherein the substrate includes a mark indicating the crystal orientation, and the controller controls the deformation of the substrate by the substrate deformation mechanism in accordance with a position of the mark on the substrate in a state in which the substrate is held by the substrate holder and a position of the target shot region on the substrate in the state.

5. The apparatus according to claim 4, wherein the controller generates corrected control information for the imprint process on the target shot region by correcting reference control information for controlling the substrate deformation mechanism, and controls the substrate deformation mechanism in accordance with the corrected control information in the imprint process on the target shot region, and the controller generates the corrected control information by correcting the reference control information based on an orientation of the mark on the substrate in the state and an orientation of the target shot region on the substrate in the state.

6. The apparatus according to claim 5, wherein in a state in which the substrate is deformed by the substrate deformation mechanism, a deflection amount of the substrate on a circumference about the center of the substrate periodically changes along the circumference, and the controller generates the corrected control information by correcting the reference control information so the deflection amount of the target shot region will be a target deflection amount in the imprint process on the target shot region.

7. The apparatus according to claim 6, wherein the controller holds a function that indicates the deflection amount of the substrate on the circumference, and the function is a function which uses, as a variable, an orientation indicating the position of the target shot region.

8. The apparatus according to claim 7, wherein the function is a periodic function.

9. The apparatus according to claim 1, wherein the substrate deformation mechanism includes a plurality of concave portions concentrically arranged on a holding surface configured to hold the substrate, and deforms the substrate by controlling the pressure of each of the plurality of concave portions.

10. The apparatus according to claim 1, wherein at least in a case in which the target shot region is a shot region arranged in a peripheral region on the substrate, the controller controls the deformation of the substrate by the substrate deformation mechanism in accordance with the orientation information and the target shot region.

11. An imprint method for performing an imprint process to form a pattern a cured product of an imprint material on a substrate by using a mold, the method comprising:

deforming the substrate so the substrate will have a convex shape toward the mold in a state in which the substrate is held by a substrate holder; and generating information for controlling the deformation of the substrate in the deforming in accordance with orientation information related to a crystal orientation of the substrate and a target shot region on which the imprint process is to be performed among a plurality of shot regions on the substrate.

12. A method of manufacturing an article comprising:

forming a pattern on a substrate by using an imprint apparatus defined in claim 1;

performing processing on the substrate on which the pattern has been formed in the forming; and manufacturing the article from the processed substrate.

* * * * *